(12) United States Patent
Ono et al.

(10) Patent No.: US 7,400,007 B2
(45) Date of Patent: Jul. 15, 2008

(54) SEMICONDUCTOR DEVICE

(75) Inventors: Syotaro Ono, Yokohama (JP); Yusuke Kawaguchi, Kanagawa-ken (JP); Yoshihiro Yamaguchi, Saitama (JP); Hirobumi Matsuki, Hyogo-ken (JP); Kiyotaka Arai, Hyogo-ken (JP)

(73) Assignee: Kabushiki Kaisha Toshiba, Tokyo (JP)

( * ) Notice: Subject to any disclaimer, the term of this patent is extended or adjusted under 35 U.S.C. 154(b) by 417 days.

(21) Appl. No.: 11/305,202

(22) Filed: Dec. 19, 2005

(65) Prior Publication Data

US 2006/0157778 A1    Jul. 20, 2006

(30) Foreign Application Priority Data

Dec. 22, 2004    (JP)    ............................ P2004-371056

(51) Int. Cl.
*H01L 27/108*    (2006.01)
(52) U.S. Cl. .................................. 257/302; 257/29.027
(58) Field of Classification Search ......... 257/300–302, 257/E29.027
See application file for complete search history.

(56) References Cited

U.S. PATENT DOCUMENTS

| 5,329,142 | A | 7/1994 | Kitagawa et al. |
| 5,448,083 | A | 9/1995 | Kitagawa et al. |
| 5,585,651 | A | 12/1996 | Kitagawa et al. |
| 5,689,121 | A | 11/1997 | Kitagawa et al. |
| 5,838,026 | A | 11/1998 | Kitagawa et al. |
| 6,060,747 | A | 5/2000 | Okumura et al. |
| 6,787,848 | B2 | 9/2004 | Ono et al. |

*Primary Examiner*—Thao X. Le
*Assistant Examiner*—Elias Ullah
(74) *Attorney, Agent, or Firm*—Oblon, Spivak, McClelland, Maier & Neustadt, P.C.

(57) ABSTRACT

A power MOSFET includes an n-type drift layer and a p-type base layer formed in a layered manner on the n-type drift layer. Trench gates are formed to penetrate the p-type base layer to reach the n-type drift layer. On the p-type base layer, $n^+$-type source regions and $p^+$-type regions are formed. These $n^+$-type source regions and $p^+$-type regions are arranged alternately along a longitudinal direction of the trench gates. The $n^+$-type source regions and the $p^+$-type regions are arranged with a slant with respect to the longitudinal direction of the trench gates.

20 Claims, 7 Drawing Sheets

SEMICONDUCTOR DEVICE

CROSS-REFERENCE TO THE INVENTION

This application is based upon and claims the benefit of priority from the prior Japanese Patent Application No. 2004-371056, filed on Dec. 22, 2004; the entire contents of which are incorporated herein by reference.

BACKGROUND OF THE INVENTION

1. Field of the Invention

The present invention relates to a semiconductor device.

2. Description of the Related Art

A trench gate structure is applied to semiconductor devices such as an IGBT (Insulated Gate Bipolar Transistor) and a MOS-FET (Metal Oxide Semiconductor-Field Effect Transistor), and is a structure that is particularly advantageous for electric power use. For example, A MOSFET having the trench gate structure has a fast switching speed and has a large electric current capacity, which is characterized by having a withstand voltage of about a few tens of volts to 300 volts. Accordingly, it is used in switching power supply for a portable terminal, a personal computer (PC), and the like.

Regarding a power semiconductor device having such a trench gate structure, an n-channel type trench MOSFET will be described as an example. In the trench MOSFET, for example, on a semiconductor wafer on which an n-type drift layer and a p-type base layer are formed in a layered manner, trenches are formed to penetrate the p-type base layer to reach the n-type drift layer. In each trench, a gate electrode material is filled via a gate insulation film. These elements constitute a trench gate. On the bottom side of the n-type drift layer, a drain electrode is formed via an $n^+$-type drain region.

On the other hand, in the p-type base layer, an $n^+$-type source region and a $p^+$-type region formed adjacent thereto are provided. Furthermore, on a top part thereof, a source electrode is formed. In a conventional MOSFET, for example, generally there is adopted a structure such that $n^+$-type source regions arranged adjacent to a trench gate are formed respectively along a forming direction of the trench, and moreover, $p^+$-type regions are formed between these $n^+$-type source regions (for example, refer to FIG. 6 of U.S. Pat. No. 3,329,707). However, in such a structure, a trench interval is restricted by the widths of the $n^+$-type source region and the $p^+$-type region, so that there is a limitation on narrowing down the trench interval.

On the other hand, along with the advance in miniaturization techniques, it is possible to set a distance between trench gates to 1 μm or shorter. Accordingly, for example, there is suggested a structure such that $n^+$-type source regions and $p^+$-type regions are arranged alternately along the forming direction of a trench between trench gates. In other words, it is a structure such that the trench gates are orthogonal to the alternately arranged $n^+$-type source regions and $p^+$-type regions. For example, U.S. Pat. No. 2,950,688 describes an IGBT in which an element upper part structure as described above is applied. Also, Japanese Patent Laid-open Application No. Hei 9-116139 describes an element structure in which trench gates are arranged so that a length from a source region to an injector region along each trench gate is longer than a shortest distance therebetween.

In the power MOSFET adopting the above-described element upper part structure, when a predetermined voltage is applied to the gate electrode material, an inverted layer is formed in a region of the p-type base layer that is adjacent to the gate insulation film, thereby generating an on-state between the source electrode and the drain electrode. In such a power MOSFET, the occupying ratio of a current path (channel) in an element effective area can be increased by miniaturizing the trench interval. Therefore, it is possible to decrease resistance of the power MOSFET in the on-state.

However, in order to decrease the on-resistance in the above-described arrangement structure of the $n^+$-type source regions and the $p^+$-type regions, the occupying ratio of the $n^+$-type source regions in an element region between the trench gates is needed to be increased. A possible problem in this case includes avalanche destruction. This avalanche destruction is caused by occurrence of a large voltage drop in the p-type base layer in an arbitrary cell due to a breakdown current, which occurs when the power MOSFET changes from on to off immediately after an inductance load is driven.

Specifically, when a parasitic npn bipolar transistor constituted of an $n^+$-type source region/a p-type base layer/an n-type drift layer turns on, a large current flows. In a cell where this parasitic bipolar transistor operates, the withstand voltage is decreased as compared to a cell where it does not operate, so that the current concentrates and flows in this cell, which finally leads to device destruction. In the above-described element upper part structure, widening of the width of the $n^+$-type source region is equal to that a high resistance is arranged on the way of a Hall current in the p-type base layer flowing into the $p^+$-type region when the breakdown occurs in the vicinity of a channel. When this resistance is large, the parasitic npn bipolar transistor can easily turn on, and as a result, the avalanche destruction can easily occur.

SUMMARY OF THE INVENTION

A semiconductor device according to one aspect of the present invention includes: a first semiconductor layer of a first conduction type; a second semiconductor layer of a second semiconductor type provided on the first semiconductor layer; trench gates each having a trench penetrating the second semiconductor layer to reach the first semiconductor layer and a conductive material filled in the trench via an insulation film; third semiconductor regions of the first conduction type formed on the second semiconductor layer and adjacent to the conductive material of each of the trench gates via the insulation film; and fourth semiconductor regions of the second conduction type formed on the second semiconductor layer and arranged alternately with the third semiconductor regions along each of the trench gates, in which the third semiconductor regions and the fourth semiconductor regions are arranged with a slant with respect to a longitudinal direction of the trench gates.

A semiconductor device according to another aspect of the present invention includes: a first semiconductor layer of a first conduction type; a second semiconductor layer of a second semiconductor type provided on the first semiconductor layer; trench gates each having a trench penetrating the second semiconductor layer to reach the first semiconductor layer and a conductive material filled in the trench via an insulation film; third semiconductor regions of the first conduction type formed on the second semiconductor layer and adjacent to the conductive material of each of the trench gates via the insulation film; and fourth semiconductor regions of the second conduction type formed on the second semiconductor layer and arranged alternately with the third semiconductor regions along each of the trench gates, in which the fourth semiconductor regions are formed with an occupying ratio of the fourth semiconductor regions in an effective element region being larger in a region farther from a gate signal input terminal region to which a drive voltage is applied than that in a region closer thereto.

A semiconductor device according to still another aspect of the present invention includes: a first semiconductor layer of a first conduction type; a second semiconductor layer of a second semiconductor type provided on the first semiconductor layer; trench gates each having a trench penetrating the second semiconductor layer to reach the first semiconductor layer and a conductive material filled in the trench via an insulation film; third semiconductor regions of the first conduction type formed on the second semiconductor layer and adjacent to the conductive material of each of the trench gates via the insulation film; and fourth semiconductor regions of the second conduction type formed on the second semiconductor layer and arranged alternately with the third semiconductor regions along each of the trench gates, in which at least a part of the third semiconductor regions and the fourth semiconductor regions is arranged with a slant with respect to a longitudinal direction of the trench gates, and the fourth semiconductor regions are formed with an occupying ratio of the fourth semiconductor regions in an effective element region being larger in a region farther from a gate signal input terminal region to which a drive voltage is applied than that in a region closer thereto.

DETAILED DESCRIPTION OF THE EMBODIMENTS

Hereinafter, embodiments of the present invention will be described with reference to the drawings. Note that in the following, the embodiments of the present invention will be described based on the drawings, but these drawings are provided for an illustrative purpose only, and the present invention is not limited to these drawings.

Figure 1:
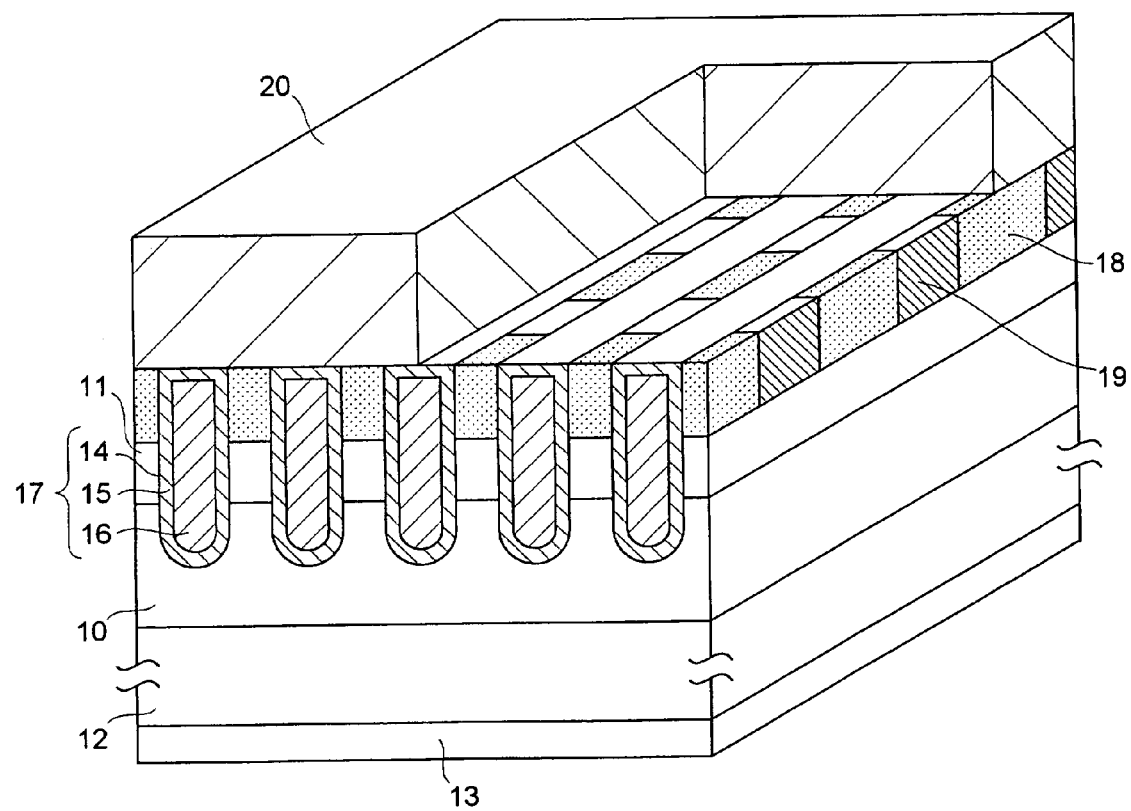
FIG. 1 is a perspective view showing, partly in a cross-section, a basic structure of a power MOSFET according to an embodiment of the present invention.

First, referring to FIG. 1, a basic structure of a semiconductor device according to an embodiment of the present invention will be described. FIG. 1 is a perspective view showing, partly in a cross-section, a basic structure of an n-channel type trench MOSFET according to the embodiment of the present invention. Note that FIG. 1 is a perspective view taking out a part of a plurality of element units formed in parallel on a semiconductor wafer and viewing it from obliquely upward, and it shows a state that a part of a source electrode being removed for ease of understanding of arrangement on a MOSFET surface.

In FIG. 1, the numeral 10 denotes an n-type drift layer as a first semiconductor layer of a first conduction type. On the n-type drift layer 10, a p-type base layer 11 is formed in a layered manner as a second semiconductor layer of a second conduction type. Under the n-type drift layer 10, there exists an $n^+$-type drain region 12, and on a bottom side of the $n^+$-type drain region 12, a drain electrode 13 is formed. Note that this structure is fabricated by, for example, forming an $n^-$-type layer (n-type drift layer 10) and a p-type layer (p-type base layer 11) in a layered manner in this order on an $n^+$-type semiconductor wafer (12).

On a surface side of the semiconductor wafer having the n-type drift layer 10 and the p-type base layer 11, trenches 14 are formed to penetrate the p-type base layer 11 to reach the n-type drift layer 10. In each of the trenches 14, a gate electrode material 16 is filled via a gate insulation film 15 formed on an inner wall thereof, and they constitute a trench gate 17. For the gate electrode material 16, a conductive material such as polysilicon is used for example.

On the other hand, on the p-type base layer 11, $n^+$-type source regions 18 as third semiconductor regions of the first conduction type and $p^+$-type regions 19 as fourth semiconductor regions of the second conduction type are formed. These $n^+$-type source regions 18 and the $p^+$-type regions 19 are formed in an element region between the trench gates 17, and arranged alternately adjacent to each other along the longitudinal direction of the trench gates 17 (forming direction/depth direction in the drawing of the trenches 14). The $n^+$-type source regions 18 are arranged adjacent to the gate electrode material 16 of each trench gate 17 via the gate insulation material 15. Furthermore, on the $n^+$-type source regions 18 and the $p^+$-type regions 19, a source electrode 20 connected thereto is formed.

The trench gates 17 are each fabricated as follows for example. First, a trench 14 in one direction is formed in parallel on an upper face of an element. After a gate insulation film 15 is formed on an inner wall of the trench 14, a gate electrode material 16 is filled therein. Furthermore, an upper side of the gate electrode material 16 is also covered by the gate insulation film 15. Thus, the trench gates 17 are each fabricated. Next, on the p-type base layer 11, regions to be the $n^+$-type source regions 18 and regions to be the $p^+$-type regions 19 are formed respectively in a stripe shape and alternately adjacent to each other to cross the trench gates 17. Note that each stripe region is separated by the trench gates 17 to be the $n^+$-type source regions 18 and $p^+$-type regions 19 formed alternately adjacent to each other in the element region between the trench gates 17.

In a power MOSFET having such a structure, when a predetermined voltage is applied to the gate electrode material 16, an inverted layer is formed in a region of the p-type base layer 11 that is adjacent to the gate insulation film 15, generating an on-state between the source electrode 20 and the drain electrode 13. Also, when a breakdown occurs in the vicinity of a channel when the power MOSFET changes from on to off, a Hall current flowing in the p-type base layer 11 flows into the $p^+$-type regions 19.

Figure 2:
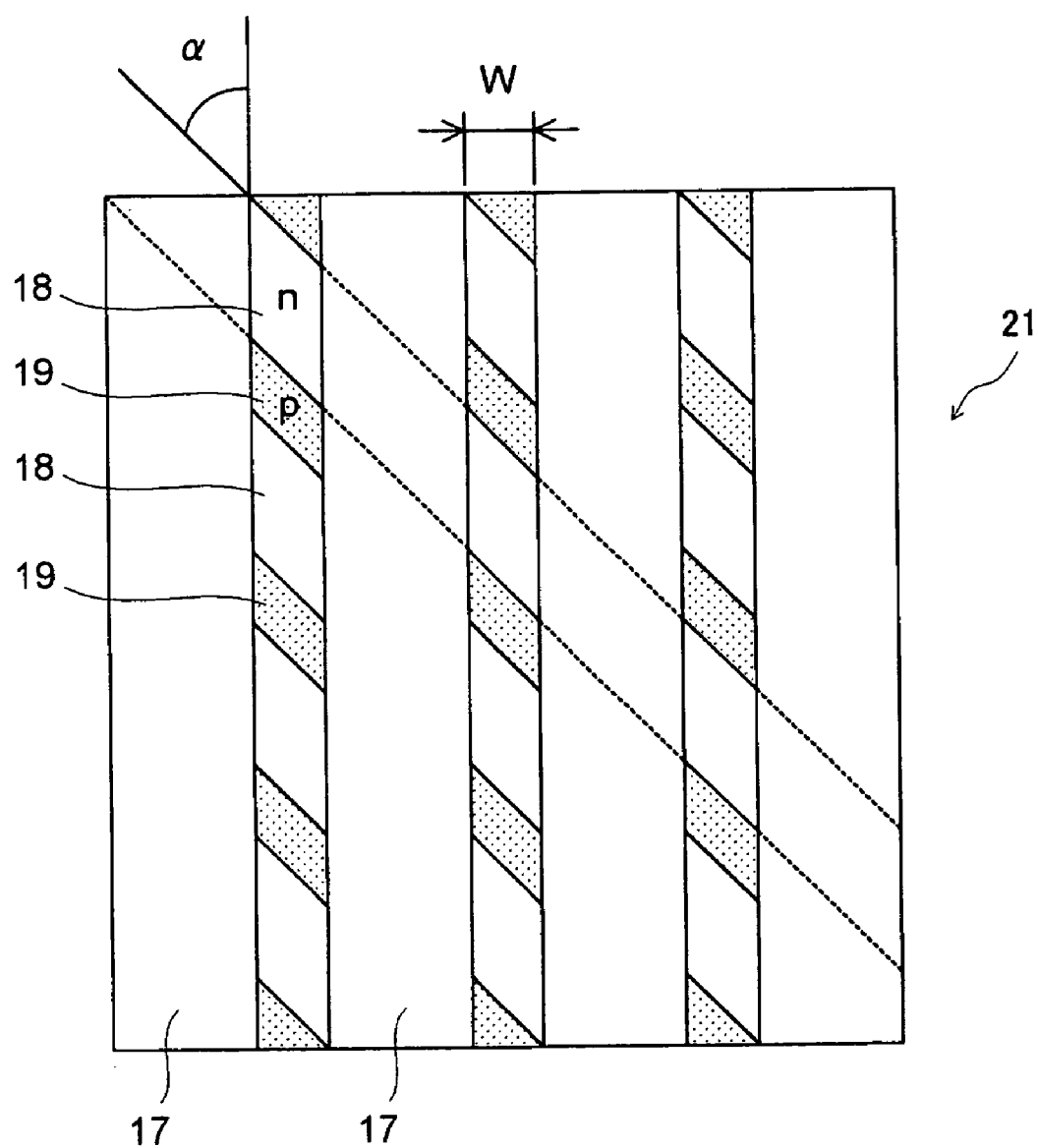
FIG. 2 is a plan view showing an upper part structure of the power MOSFET according to a first embodiment of the present invention.
Figure 3:
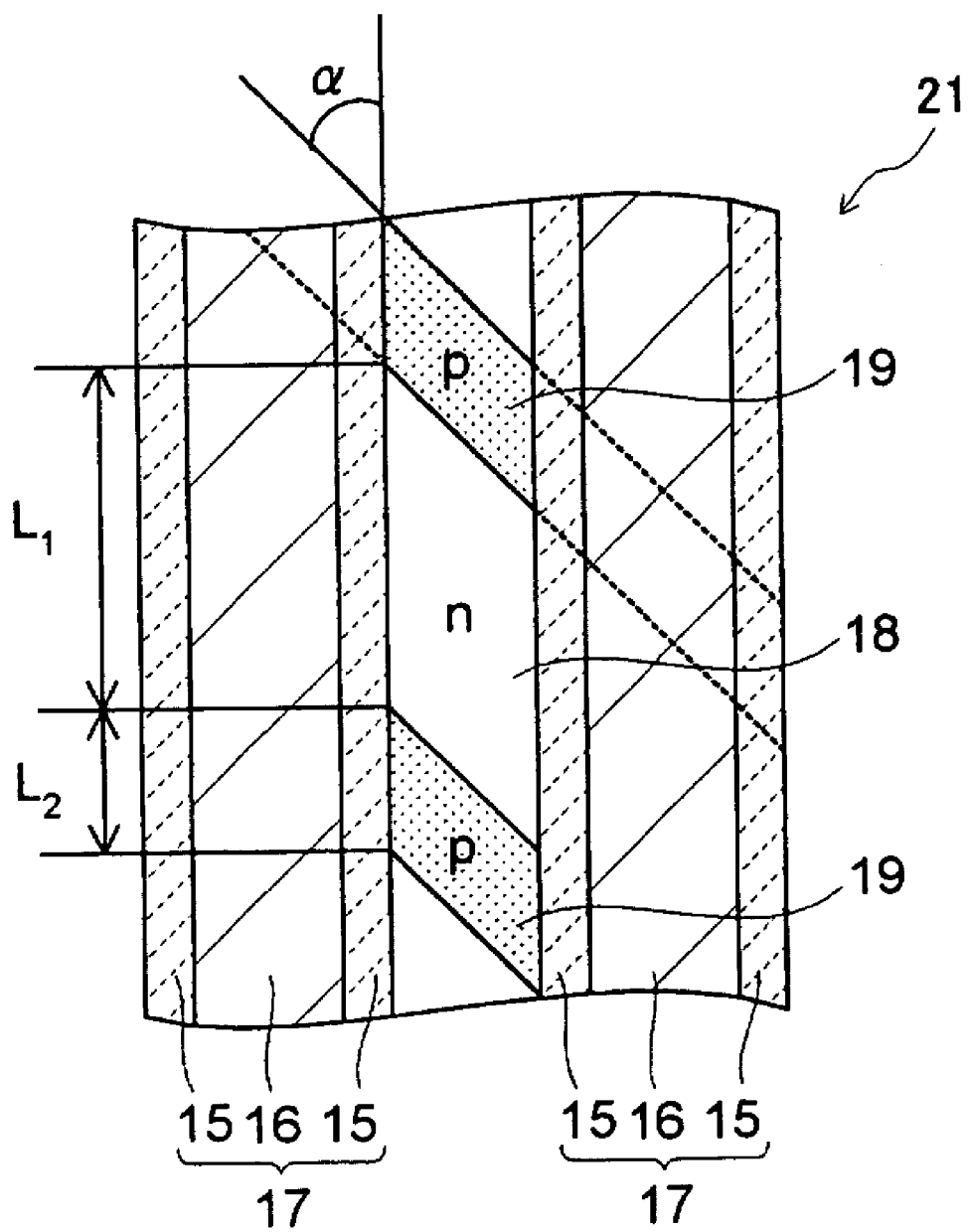
FIG. 3 is a cross-sectional view showing an enlarged part of the power MOSFET according to the first embodiment of the present invention.

A power MOSFET according to a first embodiment of the present invention has the above-described basic structure (the basic structure of the MOSFET having the trench gate structure shown in FIG. 1). Further, as shown in FIG. 2 and FIG. 3, it has a structure such that the $n^+$-type source regions 18 and the $p^+$-type regions 19 are arranged to cross the longitudinal direction of the trench gates 17 with a slant. FIG. 2 is a plan view showing an element upper part structure of the power MOSFET 21 according to the first embodiment (the structure of a portion from which the source electrode 20 is removed). FIG. 3 is an enlarged cross-sectional view taken along a portion in the plane direction (depth direction in FIG. 1) where the trench gates 17 and the $n^+$-type source regions 18 and the $p^+$-type regions 19 of the power MOSFET 21 exist. The semiconductor device including trench gates is not limited to the power MOSFET, but is applicable to an IGBT and the like. Other embodiments are the same.

The trench gates 17 are arranged to cross a forming direction of the $n^+$-type source regions 18 and the $p^+$-type regions 19 at an angle α. The forming direction of the $n^+$-type source regions 18 and the $p^+$-type regions 19 indicate a forming direction of the above-described respective stripe regions. The longitudinal direction of the trench gates 17 (forming direction of the trenches 14) crosses the forming direction of the $n^+$-type source regions 18 and the $p^+$-type regions 19 with a slant shown by the angle α. In other words, an interface between the $n^+$-type source regions 18 and the $p^+$-type regions 19 is arranged in a slant state at the angle α with respect to the longitudinal direction of the trench gates 17.

As described above, by arranging the $n^+$-type source regions 18 and the $p^+$-type regions 19 with the slant with respect to the longitudinal direction of the trench gates 17, a distance from each portion of the p-type base layer 11 located below each $n^+$-type source region 18 to each $p^+$-type region 19 can be reduced. The reduction of the distance from the p-type base layer 11 to each $p^+$-type region 19 implies that underlying resistance immediately under each $n^+$-type source region 18 to the breakdown current that occurs in the vicinity of the channel is reduced. By reducing the underlying resistance immediately under each $n^+$-type source region 18, current concentration based on the driving of the aforementioned parasitic npn bipolar transistor is reduced. Therefore, it is possible to suppress occurrence of the avalanche destruction due to the driving of the parasitic npn bipolar transistor.

Figure 8:
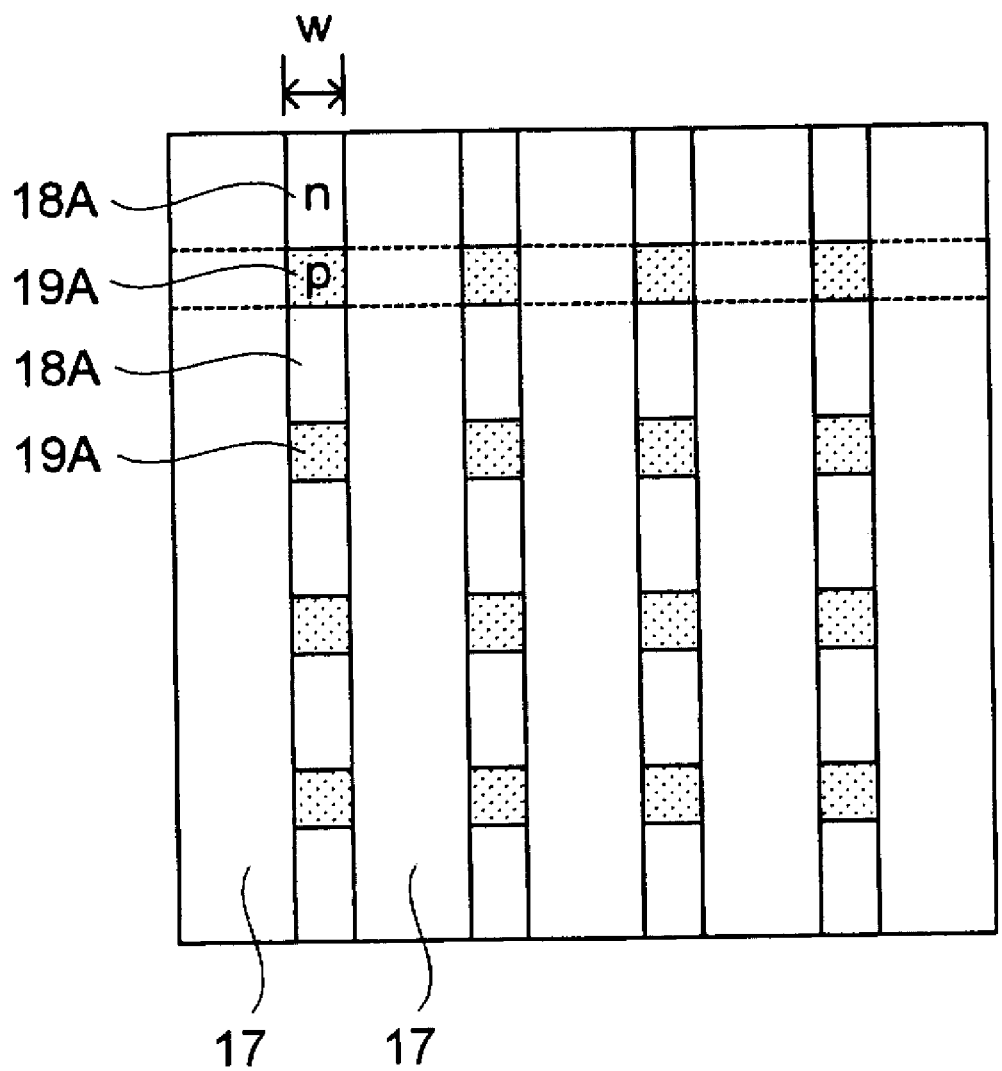
FIG. 8 is a plan view showing an upper part structure of a power MOSFET according to a comparative example.

Specifically, as shown in FIG. 8, in the structure in which the longitudinal direction of the trench gates 17 and the forming direction of the $n^+$-type source regions 18A and the $p^+$-type regions 19A are orthogonal to each other, a distance from each portion of the p-type base layer 11 located below each $n^+$-type source region 18A to each $p^+$-type region 19 depends on a length of each $n^+$-type source region 18A (the length in the longitudinal direction of the trench gates 17). In the meantime, when the $n^+$-type source regions 18 and the $p^+$-type regions 19 are arranged in a slant state at the angle a with respect to the longitudinal direction of the trench gates 17, the $p^+$-type regions 19 are in a state of cutting into the $n^+$-type source regions 18 according to the angle a, so that by the amount thereof, the distance from each portion of the p-type base layer 11 to each $p^+$-type region 19 is reduced. Thus, the underlying resistance immediately under each $n^+$-type source region 18 is reduced, and the current concentration based on the driving of the parasitic npn bipolar transistor is reduced. Specifically, the occurrence of the avalanche destruction is suppressed.

An improving effect in avalanche resistance based on the slant arrangement of the $n^+$-type source regions 18 and the $p^+$-type regions 19 can be realized with the ratio of a reference length (the length of a portion in contact with the trench gates 17) $L_1$ for the $n^+$-type source regions 18 to a reference length (the length of a portion in contact with the trench gates 17) $L_2$ for the $p^+$-type regions 19, which are shown in FIG. 3, being the same as those of a conventional orthogonal structure. Therefore, when a distance W between trenches is constant, the avalanche resistance can be increased while maintaining the occupying ratio of the $n^+$-type source regions 18 in the element region between the trench gates 17 and reducing on-resistance. Thus, it is possible to improve practicability and reliability of the power MOSFET 21 having the trench gate structure.

The ratio of the $n^+$-type source regions 18 to the $p^+$-type regions 19 is preferred to be set in the range such that $L_1:L_2=2:1$ to 5:1 for example. When the ratio $L_2/L_1$ exceeds 0.5, the occupying ratio of the $n^+$-type source regions 18 relatively decreases, and thus it is possible that a sufficient reduction effect of the on-resistance cannot be obtained. On the other hand, when the ratio $L_2/L_1$ is less than 0.2, the length of the $n^+$-type source regions 18 becomes too long, and thus it is possible that even with the slant arrangement of the $n^+$-type source regions 18 and the $p^+$-type regions 19 being adopted, the avalanche resistance cannot be increased sufficiently.

The aforementioned angle a between the forming direction of the $n^+$-type source regions 18 and the $p^+$-type regions 19 and the longitudinal direction of the trench gates 17 can be set to any angle in the range by which the reduction effect of the underlying resistance can be obtained as compared to the conventional orthogonal structure. Since precision of mask alignment in semiconductor manufacturing technologies is±1° or smaller, the angle α may be set in the range larger than such alignment precision. However, when the angle α is too large, the improving effect in avalanche resistance is not sufficient as compared to the conventional orthogonal structure, so that the angle α is preferred to be 75° or smaller. On the other hand, when the angle α is too small, shapes of each regions 18, 19 become unstable, which may cause decrease in characteristics and the like, and thus the angle α is preferred to be 10° or larger.

Figure 4:
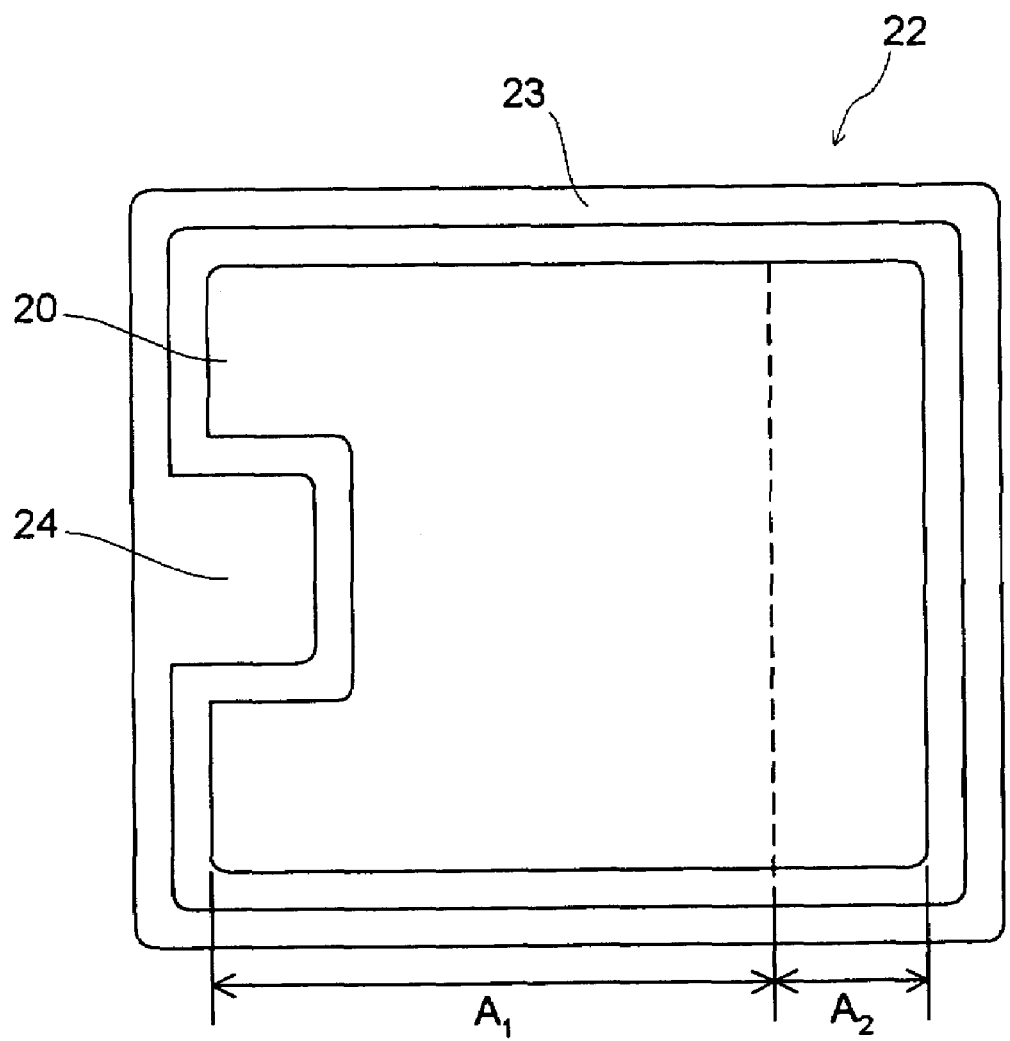
FIG. 4 is a plan view of a power MOSFET according to a second embodiment of the present invention.
Figure 5:
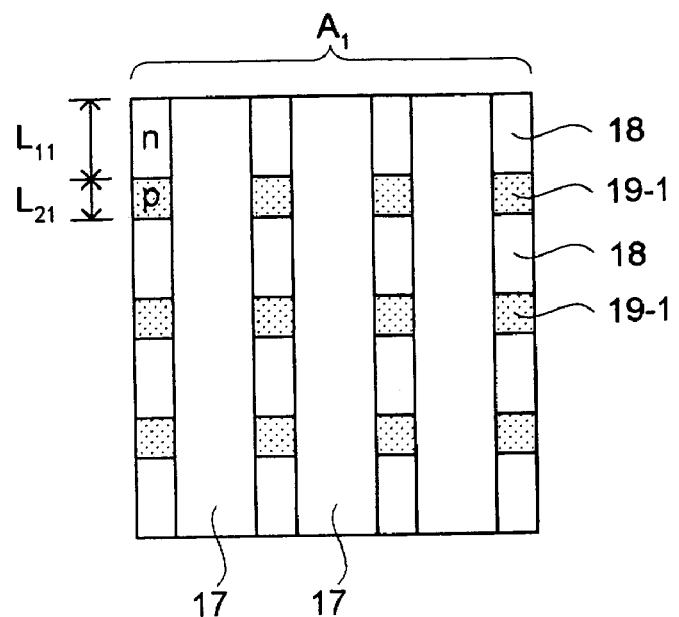
FIG. 5 is a plan view showing an upper part structure of a region closer to a gate signal input terminal region of the power MOSFET shown in FIG. 4.
Figure 6:
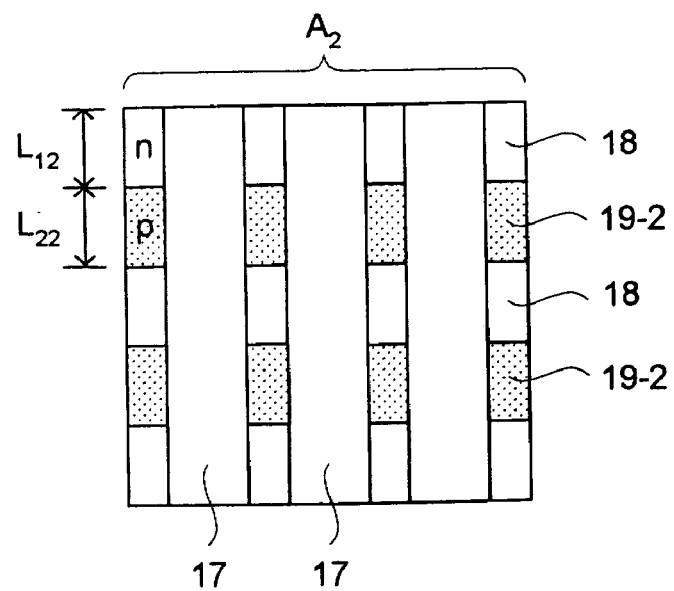
FIG. 6 is a plan view showing an upper part structure of a region farther from the gate signal input terminal region of the power MOSFET shown in FIG. 4.

Next, a semiconductor device according to a second embodiment of the present invention will be described. A power MOSFET according to the second embodiment of the present invention has the above-described basic structure (the basic structure of the MOSFET having the trench gate structure shown in FIG. 1). Further, as shown in FIG. 4 to FIG. 6, it has a structure in which a plurality of regions $A_1, A_2$ are set based on the occupying ratio of the $p^+$-type regions 19 in an effective element region. FIG. 4 is a plan view of the power MOSFET 22 according to the second embodiment. In FIG. 4, the numeral 23 denotes a gate electrode, and the numeral 24 denotes a gate signal input terminal region to which a driving voltage is applied. Specifically, to the gate electrode 23, a gate signal from an external terminal connected to the region 24 is inputted to control on/of operations of the power MOSFET 22.

Here, it is conceivable that causes of the avalanche destruction include, in addition to the driving of the aforementioned parasitic npn bipolar transistor, non-uniform turning off of the gate of the power MOSFET. Specifically, a current flows in the channel during an on-state of the gate, but when an off signal enters the gate signal input terminal region 24, a gap in off timing may be generated between a closer cell and a farther cell with respect to the gate signal input terminal region 24. This is because in a network of gate potentials constituted of a metal layer and a conductive material such as polysilicon, a delay is generated by increase in gate resistance at a further portion from the gate signal input terminal region 24.

In a transition state from on to off immediately after driving of an inductance load, when a delay according to increase in gate resistance occurs, an off cell and an on cell exist at the same time. In this case, a breakdown current concentrates in a cell that is lately turned on, which easily causes the avalanche destruction. Due to such a reason, current concentration easily occurs in a cell that is far from the gate signal input terminal region 24. In order to suppress the current concentration in an off state according to the distance from the gate signal input terminal region 24 to prevent the avalanche destruction, it is effective to reduce the resistance in the network of gate potentials to uniformly turn on and off the entire power MOSFET.

Accordingly, in the power MOSFET (the MOSFET having the trench gate structure) according to the second embodiment, the occupying ratio of the $p^+$-type regions 19 in the effective element region is set based on the distance from the gate signal input terminal region 24. Specifically, the occupying ratio of the $p^+$-type regions 19 in the effective element region is set to be larger in the second region $A_2$ farther from the gate signal input terminal region 24 than that in the first region $A_1$ closer thereto. By setting the occupying ratio of the $p^+$-type regions 19 larger, the avalanche resistance can be increased. Therefore, even when concentration of a break down current occurs in the region $A_2$ farther from the gate signal input terminal region 24, namely the region $A_2$ in which a delay in off timing easily occurs, it is possible to suppress the avalanche destruction in the region $A_2$ because the occupying ratio of the $p^+$-type regions 19 is larger.

When a distance W between trenches is constant, in the first region $A_1$ closer to the gate signal input terminal region 24, the ratio of a reference length (the length of a portion in contact with the trench gates 17) $L_{11}$ for the $n^+$-type source regions 18 to a reference length (the length of a portion in contact with the trench gates 17) $L_{21}$ for the $p^+$-type regions 19-1 is set so that the reduction effect of on-resistance can be obtained. On the other hand, for the second region $A_2$ farther from the gate signal input terminal region 24, the ratio of a reference length $L_{12}$ for the $n^+$-type source regions 18 to a reference length $L_{22}$ for the $p^+$-type regions 19-2 is set so that the avalanche resistance can be increased.

For example, when the reference lengths for the $n^+$-type source regions 18 are constant ($L_{11}=L_{12}$), the reference length $L_{22}$ for the $p^+$-type regions 19-2 in the second region $A_2$ is set longer than the reference length $L_{21}$ for the $p^+$-type regions 19-1 in the first region $A_1$ ($L_{21}<L_{22}$). Accordingly, the occupying ratio of the $p^+$-type regions 19 in the second region $A_2$ farther from the gate signal input terminal region 24 can be made larger than that in the first region $A_1$ closer to the gate signal input terminal region 24. Also, it is possible to obtain the same effect by making the reference lengths $L_{21}$, $L_{22}$ for the $p^+$-type regions 19 constant and changing the reference lengths $L_{11}$, $L_{12}$ for the $n^+$-type source regions 18.

Thus, by setting the ratio of a $p^+$-type region 19 in the second region $A_2$ larger than that in the first region $A_1$, the avalanche resistance with respect to the current concentration due to the gap in off timing can be increased. Furthermore, switching is fast in the first region $A_1$ occupying a greater part of the entire element region, and the on-resistance can be decreased by setting the occupying ratio the $n^+$-type source regions 18 larger. Therefore, it is possible to increase the avalanche resistance of the entire power MOSFET 22 while reducing the on-resistance. This largely contributes to the improvement in practicability and reliability of the power MOSFET 22 having the trench gate structure.

The ratio of the reference length $L_{12}$ for the $n^+$-type source regions 18 to the reference length $L_{22}$ for the $p^+$-type regions 19-2 in the second region $A_2$ can be set to any value in the range which can satisfy the above-described conditions based on the intended balance between the on-resistance and the avalanche resistance. For example, when the ratio of $L_{21}$ to $L_{11}$ (ratio $L_{21}/L_{11}$) in the first region $A_1$ is in the range of 0.2 to 0.5, the ratio of $L_{22}$ to $L_{12}$ (ratio $L_{22}/L_{12}$) in the second region $A_2$ is preferred to be in the range larger than 0.5 and 2 or smaller.

When the ratio $L_{22}/L_{12}$ in the second region $A_2$ is 0.5 or smaller, it is possible that the improving effect in the avalanche resistance by increasing the occupying ratio of the $p^+$-type region 19-2 cannot be obtained sufficiently. On the other hand, when the ratio $L_{22}/L_{12}$ in the second region $A_2$ exceeds 2, influence of the second region $A_2$ on the on-resistance becomes too large, and thus it is possible that the on-resistance cannot be reduced sufficiently. The ratio $L_{21}/L_{11}$ in the first region $A_1$ is preferred to be in the range of 0.2 to 0.5 ($L_{11}:L_{21}$=2:1 to 5:1) similarly to the first embodiment.

Having regard to the balance between the on-resistance and the avalanche resistance, the area of the second region $A_2$ is preferred to be in the range of 5% to 30% of the entire element region. When the area of the second region $A_2$ is smaller than 5% of the entire element region, the ratio of the region $A_2$ having the increased avalanche resistance is not sufficient, and thus it is possible that the avalanche destruction cannot be suppressed sufficiently. On the other hand, when the area of the second region $A_2$ exceeds 30% of the entire element region, it is possible that the reduction effect of on-resistance decreases.

Note that these regions having different occupying ratios of the $p^+$-type regions 19 in the effective element region are not limited to two regions (the first region $A_1$ and the second region $A_2$) as shown in FIG. 4, which may be three or more for example. In this case, the occupying ratio of the $p^+$-type regions 19 is preferred to be increased gradually based on a distance from the gate signal input terminal region 24. Furthermore, the occupying ratio of the $p^+$-type regions 19 can be changed continuously from a closer portion toward a farther portion with respect to the gate signal input terminal region 24.

Next, a semiconductor device according to a third embodiment of the present invention will be described. A power MOSFET according to the third embodiment of the present invention has the above-described basic structure (the basic structure of the MOSFET having the trench gate structure shown in FIG. 1). Further, it has an element upper part structure shown in FIG. 7. Similarly to FIG. 2, FIG. 7 is a plan view showing an element upper part structure of the power MOSFET 25 according to the third embodiment (the structure of a portion from which the source electrode 20 is removed).

Figure 7:
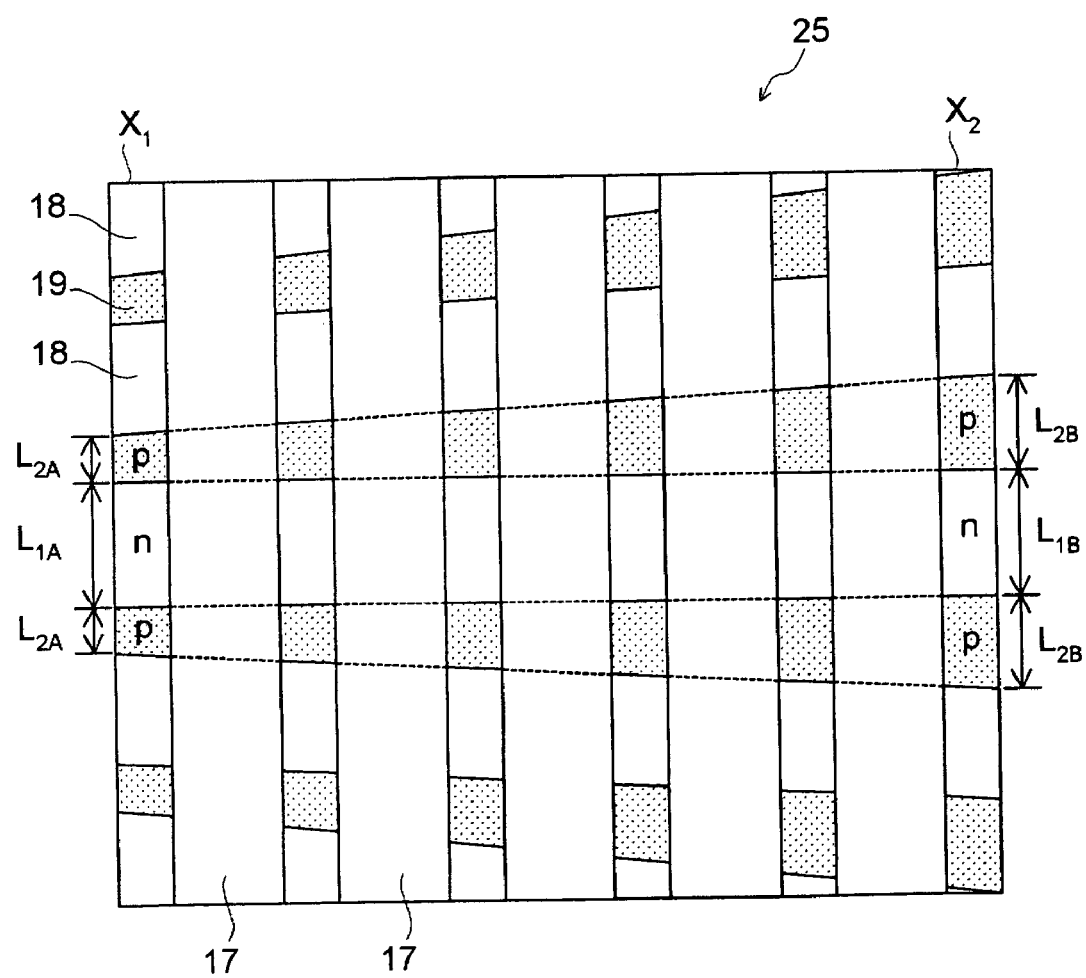
FIG. 7 is a plan view showing an upper part structure of a power MOSFET according to a third embodiment of the present invention.

In the element upper part structure of the power MOSFET 25 shown in FIG. 7, at least a part of the forming direction of the $n^+$-type source regions 18 and the $p^+$-type regions 19 has a slant with respect to the longitudinal direction of the trench gates 17 so that the occupying ratio of the $p^+$-type regions 19 in an effective element region is larger in a region (the right edge region in the drawing) $X_2$ farther from a gate signal input terminal region than that in a region (the left edge region in the drawing) $X_1$ closer thereto. According to this slant, the ratio (reference length ratio=$L_2/L_1$) of a reference length $L_2$ for the $p^+$-type regions 19 to a reference length $L_1$ for the $n^+$-type source regions 18 increases continuously from the region closer to the gate signal input terminal region toward the region farther therefrom.

When a reference length ratio for the region $X_1$ closer to the gate signal input terminal region is $L_{2A}/L_{1A}$, and a reference length ratio for the region $X_2$ further from the gate signal input terminal region is $L_{2B}/L_{1B}$, a value of $L_{2B}/L_{1B}$ is larger than a value of $L_{2A}/L_{1A}$ ($L_{2A}/L_{1A}<L_{2B}/L_{1B}$), and furthermore, the reference length ratio ($L_2/L_1$) continuously increases from the region $X_1$ to the region $X_2$. Based on such variation in the reference length ratio, by setting the occupying ratio of the p+-type regions 19 in the effective element region larger in the region $X_2$ than in the region Xi, the avalanche resistance with respect to current concentration due to the gap in off timing can be increased, similarly to the second embodiment.

Furthermore, the forming direction of the n+-type source regions 18 and the p+-type regions 19 and the longitudinal direction of the trench gates 17 are arranged with a slant. Therefore, at least a part of an interface between the n+-type source regions 18 and the p+-type regions 19 is arranged in a slant state with respect to the longitudinal direction of the trench gates 17. Accordingly, similarly to the first embodiment, the underlying resistance immediately under the n+-type source regions 18 is reduced with respect to the breakdown current that occurs in the vicinity of the channel, and the driving of the parasitic npn bipolar transistor can be suppressed.

Thus, the power MOSFET 25 according to the third embodiment can realize both improvement in the avalanche resistance with respect to the current concentration due to the gap in off timing and reduction in the current concentration based on the driving of the parasitic npn bipolar transistor. Accordingly, it is possible to more effectively suppress occurrence of the avalanche destruction while the on-resistance of the power MOSFET 25 is reduced.

It is preferred that specific conditions such as the ratio of $L_1$ to $L_2$ for the power MOSFET 25 and a forming angle of the respective regions 18, 19 are the same as those in the first and second embodiments. For example, when the ratio of $L_{2A}$ to $L_{1A}$ ($L_{2A}/L_{1A}$ ratio) in the region $X_1$ is in the range of 0.2 to 0.5, the ratio of $L_{2B}$ to $L_{1B}$ ($L_{2B}/L_{1B}$ ratio) in the region $X_2$ is preferred to be in the range larger than 0.5 and 2 or smaller. The slant of the forming direction of the p+-type regions 19 with respect to the longitudinal direction of the trench gates 17 is preferred to be 10° or larger and smaller than 90°. This slant is gradually increased for example outward from a middle portion.

Note that the present invention is not limited to the above-described embodiments, but is applicable to various semiconductor devices including trench gates. The present invention can be applicable to an IGBT and the like. Such semiconductor devices are also included in the present invention. In an implementing stage, the present invention may be modified in various ways without departing from the spirit of the present invention. Also, the respective embodiments can be implemented in an appropriately combined manner as far as possible, and in such a case, combined effects can be obtained. Moreover, the above-described embodiments include various stages of the invention, and various inventions may be extracted therefrom by appropriate combinations of plural disclosed components.

What is claimed is:

1. A semiconductor device, comprising:
a first semiconductor layer of a first conduction type;
a second semiconductor layer of a second semiconductor type provided on the first semiconductor layer;
trench gates each having a trench penetrating the second semiconductor layer to reach the first semiconductor layer and a conductive material filled in the trench via an insulation film;
third semiconductor regions of the first conduction type formed on the second semiconductor layer and adjacent to the conductive material via the insulation film; and
fourth semiconductor regions of the second conduction type formed on the second semiconductor layer and arranged alternately with the third semiconductor regions along each of the trench gates,
wherein the third semiconductor regions and the fourth semiconductor regions are arranged with a slant with respect to a longitudinal direction of the trench gates.

2. The semiconductor device as set forth in claim 1,
wherein a forming direction of the third semiconductor regions and the fourth semiconductor regions crosses the longitudinal direction of the trench gates with the slant.

3. The semiconductor device as set forth in claim 1,
wherein when an angle between an interface between the third semiconductor region and the fourth semiconductor region and the longitudinal direction of the trench gate is α, the third semiconductor regions and the fourth semiconductor regions are arranged with the angle α in the range of 10° to 75°.

4. The semiconductor device as set forth in claim 1,
wherein when the length of a portion of the third semiconductor region in contact with the trench gate is $L_1$ and the length of a portion of the fourth semiconductor region in contact with the trench gate is $L_2$, the third semiconductor regions and the fourth semiconductor regions satisfy the range such that $L_1:L_2=2:1$ to $5:1$.

5. The semiconductor device as set forth in claim 1,
Wherein the second semiconductor layer includes a p-type base layer, the third semiconductor regions include n+-type source regions, and the fourth semiconductor regions include p+-type regions.

6. The semiconductor device as set forth in claim 1,
Wherein the semiconductor device comprises a power MOSFET or an IGBT.

7. A semiconductor device, comprising:
a first semiconductor layer of a first conduction type;
a second semiconductor layer of a second semiconductor type provided on the first semiconductor layer;
trench gates each having a trench penetrating the second semiconductor layer to reach the first semiconductor layer and a conductive material filled in the trench via an insulation film;
third semiconductor regions of the first conduction type formed on the second semiconductor layer and adjacent to the conductive material of each of the trench gates via the insulation film; and
fourth semiconductor regions of the second conduction type formed on the second semiconductor layer and arranged alternately with the third semiconductor regions along each of the trench gates,
wherein the fourth semiconductor regions are formed with an occupying ratio of the fourth semiconductor regions in an effective element region being larger in a region farther from a gate signal input terminal region to which a drive voltage is applied than that in a region closer thereto.

8. The semiconductor device as set forth in claim 7,
wherein when the length of a portion of the third semiconductor region in contact with the trench gate is $L_1$, the length of a portion of the fourth semiconductor region in contact with the trench gate is $L_2$, and a length ratio thereof is $L_2/L_1$, the effective element region includes a plurality of regions having different the length ratios $L_2/L_1$.

9. The semiconductor device as set forth in claim 7,
wherein the effective element region has a first region closer to the input terminal region and a second region farther from the input terminal region, and an occupying ratio of the fourth semiconductor regions in the second region is larger than that in the first region.

10. The semiconductor device as set forth in claim 9,
wherein when the length of a portion of the third semiconductor region in contact with the trench gate is $L_1$ and the length of a portion of the fourth semiconductor region in contact with the trench gate is $L_2$, the second region includes the third semiconductor regions each having $L_1$ equal to that in the first region and the fourth semiconductor regions each having $L_2$ larger than that in the first region.

11. The semiconductor device as set forth in claim 9,
wherein when the length of a portion of the third semiconductor region in contact with the trench gate is $L_1$, the length of a portion of the fourth semiconductor region in contact with the trench gate is $L_2$, and a length ratio thereof is $L_2/L_1$, the length ratio $L_2/L_1$ in the first region satisfies the range of 0.2 to 0.5, and the length ratio $L_2/L_1$ in the second region satisfies the range larger than 0.5 and 2 or smaller.

12. The semiconductor device as set forth in claim 9,
wherein the second regions occupy the range of 5% to 30% in the entire effective element region.

13. The semiconductor device as set forth in claim 7,
Wherein the second semiconductor layer includes a p-type base layer, the third semiconductor regions include $n^+$-type source regions, and the fourth semiconductor regions include $p^+$-type regions.

14. The semiconductor device as set forth in claim 7,
Wherein the semiconductor device comprises a power MOSFET or an IGBT.

15. A semiconductor device, comprising:
a first semiconductor layer of a first conduction type;
a second semiconductor layer of a second semiconductor type provided on the first semiconductor layer;
trench gates each having a trench penetrating the second semiconductor layer to reach the first semiconductor layer and a conductive material filled in the trench via an insulation film;
third semiconductor regions of the first conduction type formed on the second semiconductor layer and adjacent to the conductive material of each of the trench gates via the insulation film; and
fourth semiconductor regions of the second conduction type formed on the second semiconductor layer and arranged alternately with the third semiconductor regions along each of the trench gates,
wherein at least a part of the third semiconductor regions and the fourth semiconductor regions is arranged with a slant with respect to a longitudinal direction of the trench gates, and the fourth semiconductor regions are formed with an occupying ratio of the fourth semiconductor regions in an effective element region being larger in a region farther from a gate signal input terminal region to which a drive voltage is applied than that in a region closer thereto.

16. The semiconductor device as set forth in claim 15,
wherein when the length of a portion of the third semiconductor region in contact with the trench gate is $L_1$, the length of a portion of the fourth semiconductor region in contact with the trench gate is $L_2$, and a length ratio thereof is $L_2/L_1$, the fourth semiconductor regions are formed with the length ratio $L_2/L_1$ continuously increasing from the region closer to the input terminal region toward the region farther therefrom.

17. The semiconductor device as set forth in claim 16,
wherein the length ratio $L_2/L_1$ in the region closer to the input terminal region satisfies the range of 0.2 to 0.5, and the length ratio $L_2/L_1$ in the region farther from the input terminal region satisfies the range larger than 0.5 and 2 or smaller.

18. The semiconductor device as set forth in claim 15,
wherein when an angle between an interface between the third semiconductor region and the fourth semiconductor region and the longitudinal direction of the trench gate is α, at least the part of the third semiconductor regions and the fourth semiconductor regions is arranged with the angle α in the range of 10° or larger and smaller than 90°.

19. The semiconductor device as set forth in claim 15,
Wherein the second semiconductor layer includes a p-type base layer, the third semiconductor regions include $n^+$-type source regions, and the fourth semiconductor regions include $p^+$-type regions.

20. The semiconductor device as set forth in claim 15,
Wherein the semiconductor device comprises a power MOSFET or an IGBT.

\* \* \* \* \*